United States Patent [19]

Bosselmann

[11] Patent Number: 5,656,934
[45] Date of Patent: Aug. 12, 1997

[54] OPTICAL METHOD OF MEASURING AN ALTERNATING ELECTRICAL CURRENT, INCLUDING TEMPERATURE COMPENSATION, AND A DEVICE FOR CARRYING OUT THE METHOD

[75] Inventor: Thomas Bosselmann, Erlangen, Germany

[73] Assignee: Siemens Aktiengesellschaft, Munich, Japan

[21] Appl. No.: 532,777

[22] PCT Filed: Mar. 10, 1994

[86] PCT No.: PCT/DE94/00248

§ 371 Date: Sep. 29, 1995

§ 102(e) Date: Sep. 29, 1995

[87] PCT Pub. No.: WO94/24572

PCT Pub. Date: Oct. 27, 1994

[30] Foreign Application Priority Data

Apr. 14, 1993 [DE] Germany ............... 43 12 184.5

[51] Int. Cl.⁶ .................................................. G01R 31/00
[52] U.S. Cl. ................. 324/96; 324/117 R; 324/244.1
[58] Field of Search ......................... 324/752, 244.1, 324/117 R, 96, 750; 356/368, 367, 365, 364, 377; 250/231.1, 225, 227, 310, 311

[56] References Cited

U.S. PATENT DOCUMENTS

| | | | |
|---|---|---|---|
| 4,442,350 | 4/1984 | Rashleigh | 324/96 |
| 4,564,754 | 1/1986 | Sato et al. | 324/96 |
| 4,584,470 | 4/1986 | Iizuka et al. | 324/96 |
| 4,755,665 | 7/1988 | Ulmer, Jr. et al. | 250/214 |
| 4,973,899 | 11/1990 | Jones et al. | 324/96 |

FOREIGN PATENT DOCUMENTS

| | | |
|---|---|---|
| 0 088 419 | 9/1983 | European Pat. Off. |
| 0 557 090 | 8/1993 | European Pat. Off. |
| WO91/01501 | 2/1991 | WIPO. |

OTHER PUBLICATIONS

Proceedings Of The Conference On Optical Fiber Sensors OFS/1988, New Orleans, US, pp. 288–291 (month unavailable).

Primary Examiner—Vinh P. Nguyen
Attorney, Agent, or Firm—Kenyon & Kenyon

[57] ABSTRACT

An alternating current in a conductor is measured using a Faraday element. The Faraday element is disposed around the conductor and linearly polarized light is supplied to the device. The plane of polarization of the linearly polarized light is rotated through a measuring angle in the Faraday element. This light is divided into two light signals having planes of polarization at right angles to each other. The two light signals are converted into corresponding electrical signals by optoelectric converters. These electric signals are split into their direct signal components and their alternating signal components. The quotients of the difference and sum of the alternating signal components as well as the quotient of the difference and sum of the direct signal components are calculated. A temperature-compensated measuring signal is derived from these calculated quotients.

22 Claims, 1 Drawing Sheet

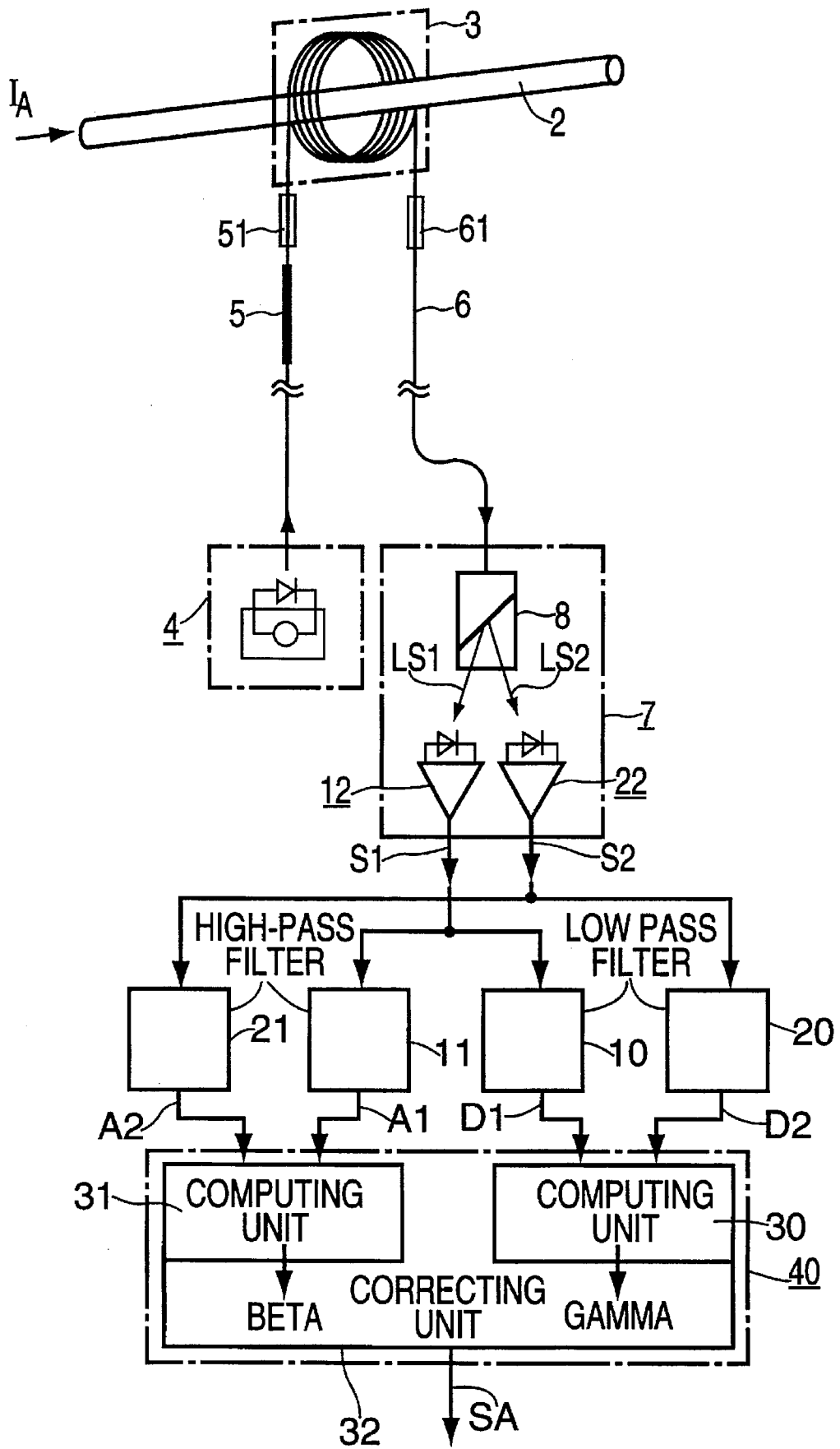

OPTICAL METHOD OF MEASURING AN ALTERNATING ELECTRICAL CURRENT, INCLUDING TEMPERATURE COMPENSATION, AND A DEVICE FOR CARRYING OUT THE METHOD

BACKGROUND OF THE INVENTION

The present invention relates to a method for measuring alternating electrical current in a current conductor by a Faraday element, and to a device for implementing the method. A method of this type is disclosed, e.g., in U.S. Pat. No. 4,755,665.

Optical measuring devices for measuring electrical current in a current conductor using the Faraday effect are known. These devices are also described as magneto-optic current transducers. The Faraday effect is understood to be the rotation of the plane of polarization of linearly polarized light in dependence upon a magnetic field. The angle of rotation is proportional to the path integral along the path covered by the light over the magnetic field, using the Verdet constant as a proportionality constant. The Verdet constant is dependent upon the material through which the light is passing, its temperature, and the wavelength of the light. To measure the current, a Faraday element, which is made of an optically transparent material that demonstrates the Faraday effect (generally glass) is arranged in proximity to the current conductor.

Linearly polarized light is transmitted by a transmitter unit through the Faraday element. The magnetic field produced by the electrical current causes rotation of the plane of polarization of the light in the Faraday element through a polarization angle of rotation. This polarization angle can be evaluated by an evaluator unit as a measure of the strength of the magnetic field and, thus, of the intensity of the electric current. The Faraday element generally surrounds the current conductor, so that the polarized light circulates around the current conductor in a quasi-closed path. As a result, the size of the polarization angle of rotation is roughly directly proportional to the amplitude of the measured current.

In one known specific embodiment disclosed in EP-B1-0088419, the Faraday element is designed as a solid glass ring which is disposed around the current conductor. In this specific embodiment, the light circulates around the current conductor only once.

In another known specific embodiment, the Faraday element is designed as part of an optical monomode fiber, which surrounds the current conductor and is in the form of a measuring winding. Thus, for one pass-through, the light circulates around the current conductor N-times, where N is the number of turns of the measuring winding. Two types of such magneto-optic current transducers having optical-fiber measuring windings are known: the transmission type and the reflection type. In the transmission type, the light is input to one end of the fiber and is emitted from the other end, so that the light only passes through the measuring winding once. On the other hand, in the reflection type, light is input to one end of the fiber and the other end of the fiber is provided with a reflective surface, so as to reflect the light. This causes the light to pass through the measuring winding a second time in the opposite direction, and to be emitted at the first end. Due to the non-reciprocity of the Faraday effect, when the light is passed through in the opposite direction, the plane of polarization of the light is rotated again by the same amount in the same direction as occurred during the initial pass-through. Thus, given the same measuring winding, the angle of rotation in a reflection type arrangement is twice as large as in the case of the transmission type. As disclosed in WO91/01501, a beam splitter may be provided to separate the light that is input to the fiber from the light that is emitted out of the fiber.

In addition, methods are known for evaluating the information contained in the rotated plane of polarization of the measuring light over the measured current. Further, corresponding devices for implementing these methods are known, in which, in principle, all the specific embodiments of Faraday elements can be utilized.

One problem encountered in all magneto-optic current transducers is the interference effect caused by linear birefringence (i.e., double refraction) in the Faraday element and the optical transmission paths. Linear birefringence of this type can be caused by mechanical stresses in the material. These stresses may be caused, for example, by bending, vibration or, in particular, by temperature variations.

In the magneto-optic current transducer disclosed in EP-B1-O 088 419, the light from a light source is linearly polarized by a polarizer and then coupled into the Faraday element. The linearly polarized light passes through the Faraday element and is emitted. The emitted light is split by a Wollaston prism, which acts as an analyzer, into two linearly polarized light signals A and B with planes of polarization disposed at right angles to one another. These two light signals A and B are transmitted via corresponding optical transmission fibers to corresponding light detectors and are converted into corresponding electrical signals PA and PB. From these two signals PA and PB, a Faraday angle of rotation is calculated as a measuring signal by a computing unit. This measuring signal corresponds to the expression (PA−PB/PA+PB), which is the quotient of the difference between the two signals over the sum of the two signals. The use of this quotient compensates for different sensitivities of the light detectors and different damping factors for the intensities of the light signals A and B in the two transmission fibers. However, the use of the quotient does not compensate for temperature effects.

In another known evaluation method, the two signals PA and PB are each subdivided by a filter into their direct-current components PA(DC) and PB(DC) and their alternating-current components PA(AC) and PB(AC). For each of the signals PA and PB, the quotient QA=PA(AC)/PA(DC) or QB=PB(AC)/PB(DC) is formed from the alternating-current components PA(AC) or PB(AC) and from the direct-current component PA(DC) or PB(DC) to compensate for varying light intensities caused by fluctuations in transmission and sensitivity. From each of these two quotients QA and QB, an average time value $\overline{Q}$ and $\overline{QB}$ is generated and, finally, from these two average values $\overline{QA}$ and $\overline{QB}$, a quotient Q=$\overline{QA}/\overline{QB}$ is formed. Within the framework of an iteration method, a comparison is made with standardized values stored in a table of values (look-up table) to obtain a correction factor K for the calculated quotient Q. The value Q×K, corrected by this correction factor K, is retrieved as a temperature-compensated measuring value for the measured current. This method makes it possible to reduce the temperature sensitivity of the magneto-optic current transducer by about 50 times. (Proc. Conf. Opt. Fiber Sensors OFS 1988, New Orleans, pp. 288–291 and U.S. Pat. No. 4,755,665). However, the above-described iteration method is quite expensive.

SUMMARY OF THE INVENTION

The present invention provides a method for measuring alternating electrical current, in a current conductor using the Faraday effect. The present invention provides a reduction in the effects of temperature on the measuring signal. The invention also provides a device for implementing the method.

According to one embodiment of the present invention, a method for measuring alternating electrical current in a current conductor by a Faraday element associated with the current conductor includes the following steps: supplying linearly polarized light to the Faraday element, wherein a plane of polarization of the linearly polarized light is rotated through a measuring angle on the basis of the Faraday effect and the measuring angle is dependent on the alternating current, outputting the light having a rotated polarization plane from the Faraday element and dividing the outputted light into first and second light signals, which have different planes of polarization. The method further includes converting the first and second light signals into first and second electrical signals, respectively, wherein each of the electrical signals is dependent upon the intensity of a corresponding light signal, dividing each of the first and second electrical signals into a direct-signal component and an alternating-signal component, deriving an angular direct component, which is dependent on a temperature in both the Faraday element and in optical transmission paths of the light, from the direct-signal components of the first and second electrical signals, and deriving an angular alternating component, which is dependent on both the alternating current and the temperature, from the alternating-signal components of the first and second electrical signals. In addition, the method further includes determining a substantially temperature independent measuring signal for the alternating current from the angular alternating component and the angular direct component.

In one preferred embodiment, the angular direct component is derived from a quotient of a difference of the direct-signal components of the first and second electrical signals and a sum of the two direct-signal components.

In another preferred embodiment, the angular direct component is derived from a quotient of one of the direct-signal components and a sum of the two direct-signal components.

In yet another preferred embodiment, the angular direct component is derived from a quotient of a difference of the alternating-signal components of the first and second electrical signals and a sum of the two alternating-signal components.

In another preferred embodiment, the angular alternating component is derived from a quotient of one of the alternating-signal components and a sum of the two alternating-signal components.

In one embodiment of the invention, a device for measuring alternating electrical current in a current conductor, includes the following elements: a Faraday element, associated with the current conductor, which receives and emits light, a polarized light supply, which supplies linearly polarized light to the Faraday element, wherein a plane of polarization of the linearly polarized light is rotated through a measuring angle on the basis of the Faraday effect and the measuring angle is dependent on the alternating current, and a beam-splitting analyzer, optically connected to the Faraday element, which divides the linearly polarized light emitted from the Faraday element into first and second light signals, which have different polarization planes. The device further includes first and second optoelectric converters for respectively converting the first and second light signals into first and second electrical signals, wherein each electrical signal is dependent upon the intensity of a corresponding light signal, a divider unit which divides the first electrical signal into a first alternating-signal component and a first direct-signal component and divides the second electrical signal into a second alternating-signal component and a second direct-signal component, and an evaluator unit.

The evaluator unit performs the following functions: deriving an angular direct component from the direct-signal components, the angular direct component being dependent upon both a temperature of the Faraday element and optical transmission paths for the light, deriving an angular alternating component from the alternating-signal components, the angular alternating component being dependent upon the alternating current and the temperature, and determining a substantially temperature-independent measuring signal for the alternating current from the angular alternating component and the angular direct component.

In a preferred embodiment, the device further includes a polarization-sustaining optical waveguide optically interconnecting the Faraday element and the beam-splitting analyzer.

BRIEF DESCRIPTION OF THE DRAWING

The FIGURE is a schematic of an exemplary device according to an embodiment of the present invention.

DETAILED DESCRIPTION

With reference to the FIGURE, a current conductor is denoted by 2, a Faraday element by 3, a light source by 4, a polarizer by 5, an optical waveguide by 6, a transducer unit by 7, two low-pass filters by 10 and 20, respectively, two high-pass filters by 11 and 21, respectively, and an evaluator unit by 40.

Light supplied by light source 4 is linearly polarized by polarizer 5. The polarized light is input to Faraday element 3 via one input of Faraday element 3. Alternatively, linearly polarized light can be directly produced by a polarizing light source, such as a laser diode.

An output of Faraday element 3 is connected to polarization-sustaining optical waveguide 6, which is preferably provided as a monomode optical fiber. Optical waveguide 6, in turn, is connected to transducer unit 7. Due to its polarization-sustaining property, damping losses in the optical waveguide 6 have virtually no effect.

In the disclosed embodiment, the Faraday element 3 itself and the transmission fiber between the light source 4 and the Faraday element 3 are designed as parts of the optical waveguide 6. The optical waveguide 6 thereby surrounds the current conductor 2, preferably concentrically, with a measuring winding having at least one measuring turn, so as to form a transmission type magneto-optic current transducer. However, a reflection type embodiment is also possible.

Moreover, a solid member of a transparent material, preferably a glass ring, can also be provided as Faraday element 3.

Splices 51 and 61 can be used as detachable connections by being positioned in front of the input and behind the output of the Faraday element 3.

In the transducer unit 7, the light emitted from the Faraday element 3, which has a polarization plane rotated by a measuring angle ALPHA due to the Faraday effect, is divided into two linearly polarized light signals LS1 and LS2 having different polarization planes. Preferably, the polarization planes LS1 and LS2 are directed at right angles to one another. For this purpose, a Wollaston prism is preferably provided as a beam-splitting analyzer 8. For the beam-splitting analyzer 8, however, it is also possible to provide two polarization filters that are crossed at a suitable angle, preferably 90°, and one beam splitter.

Next, the two light signals LS1 and LS2 are converted into electrical signals S1 and S2 by optoelectric converters 12 and 22, respectively. The electrical signals S1 and S2 are a measure of the light intensities of each of light signals LS1 and LS2, respectively. The optoelectric converters 12 and 22 preferably include receiving LEDs (light emitting diodes) connected to amplifier circuits. The two electrical signals S1 and S2 are then output by two outputs of the transducer unit 7.

The S1 electrical signal output of transducer unit 7 is electrically connected to a low-pass filter 10 and a high-pass filter 11. The S2 electric signal output of transducer unit 7 is electrically connected to low-pass filter 20 and a high-pass filter 21. The low-pass filters 10 and 20 filter out the direct-signal components (d.c. signals) D1 and D2, and the high-pass filters 11 and 21 filter out the alternating-signal components (a.c. signals) A1 and A2 of the signals S1 and S2. In another embodiment, the alternating-signal components A1 and A2 can be obtained as complements of the direct-signal components D1 and D2 by subtracting the direct-signal components D1 or D2 from the signals S1 or S2, since the following equations hold true: S1=A1+D1 and S2=A2+D2. Conversely, of course, it is also possible for the alternating-signal components A1 and A2 to be filtered out first and then for the direct-signal components D1=S1−A1 and D2=S2−A2 to be determined by calculating the alternating-signal components A1 or A2 from the total signal S1 or S2.

Next, the two direct-signal components D1 and D2 are fed to a computing unit 30, and the two alternating-signal components A1 and A2 are fed to a computing unit 31.

An angular alternating component BETA, which is still temperature dependent and contains all information about the alternating current $I_A$ in the current conductor 2, is determined by the computing unit 31 for the measuring angle ALPHA from the two alternating-signal components A1 and A2.

An angular direct component GAMMA is calculated by the computing unit 30 from the direct-signal components D1 and D2. This angular direct component GAMMA is now an unequivocal measure of the temperature in the optical system, i.e. in the Faraday element 3 and the transmission paths.

The angular alternating component BETA of the measuring angle ALPHA is corrected by the angular direct component GAMMA in a correcting unit 32 that is electrically connected to the two computing units 30 and 31. This is done in order to compensate for the interfering operating-point drift resulting from the temperature-dependent linear birefringence in the Faraday element 3 and the transmission paths. The corrected angular alternating component BETA corresponds to the temperature-compensated measuring signal SA for the measured current $I_A$, which can be tapped off at one output of the correcting unit 32. Preferably, the computing units 30 and 31 and the correcting unit 32 are combined in the evaluator unit 40.

In one embodiment of the method, the quotients are formed in the computing units 30 and 31 from the differences of their input signals and their sums. In another embodiment, the quotients are formed in the computing units 30 and 31 from one of the input signals and the sum of the input signals.

In the first case, the angular alternating component BETA is obtained from the quotient (A1−A2)/(A1+A2) with the alternating signal components A1 and A2, and the angular direct component GAMMA is obtained from the quotient (D1−D2)/(D1+D2) with the direct-signal components D1 and D2.

In the second case, the angular direct component GAMMA is obtained, for example, from the quotient D1/(D1+D2) or D2/(D1+D2), and the angular alternating component BETA is obtained from A1/(A1+A2) or A2/(A1+A2). It should be noted that it is also possible however for different functions to be realized in the computing units 30 and 31, for example combinations of the two embodiments.

In one advantageous specific embodiment, an effective Verdet constant $V_{eff}$ is determined for the angular direct component. GAMMA with the help of a table of predetermined values (look-up table) or a calibration curve. The measuring signal SA is then proportional to the product of the angular alternating component BETA and the reciprocal value of the effective Verdet constant $V_{eff}$. The measuring signal SA can, however, also be derived directly from the angular alternating component BETA and from the angular direct component GAMMA on the basis of a theoretically approximated or experimentally determined calibration curve.

All of the embodiments utilize the fact that by obtaining the angular direct component GAMMA, clear information is obtained about the temperature, and the linear birefringence that is conditioned upon it. As explained, this information can be used to compensate for the temperature of the operating point and, thus, for the measuring signal.

What is claimed is:

1. A method for measuring alternating electrical current in a current conductor by a Faraday element associated with the current conductor, said method comprising:

a) supplying linearly polarized light to the Faraday element, wherein a plane of polarization of the linearly polarized light is rotated through a measuring angle on the basis of the Faraday effect, the measuring angle being dependent on the alternating current;

b) outputting the light having a rotated polarization plane from the Faraday element and dividing the outputted light into first and second light signals, said first and second light signals having different planes of polarization;

c) converting the first and second light signals into first and second electrical signals, respectively, each of said electrical signals being dependent upon the intensity of a corresponding light signal;

d) dividing each of the first and second electrical signals into a direct-signal component and an alternating-signal component;

e) deriving an angular direct component, which is dependent on a temperature in both the Faraday element and in optical transmission paths of the light, from the direct-signal components of the first and second electrical signals;

f) deriving an angular alternating component, which is dependent on the alternating current and the temperature, from the alternating-signal components of the first and second electrical signals; and g) determining a substantially temperature independent measuring signal for the alternating current from the angular alternating component and the angular direct component.

2. The method according to claim 1, wherein the angular direct component is derived from a quotient of a difference of the direct-signal components of the first and second electrical signals and sum of the two direct-signal components.

3. The method according to claim 2, wherein the angular direct component is derived from a quotient of a difference of the alternating-signal components of the first and second electrical signals and a sum of the two alternating-signal components.

4. The method according to claim 3, wherein an effective Verdet constant is derived from the angular direct component.

5. The method according to claim 2, wherein the angular alternating component is derived from a quotient of one of the alternating-signal components and a sum of the two alternating-signal components.

6. The method according to claim 5, wherein an effective Verdet constant is derived from the angular direct component.

7. The method according to claim 2, wherein an effective Verdet constant is derived from the angular direct component.

8. The method according to claim 1, wherein the angular direct component is derived from a quotient of one of the direct-signal components and a sum of the two direct-signal components.

9. The method according to claim 8, wherein the angular direct component is derived from a quotient of a difference of the alternating-signal components of the first and second electrical signals and a sum of the two alternating-signal components.

10. The method according to claim 9, wherein an effective Verdet constant is derived from the angular direct component.

11. The method according to claim 8, wherein the angular alternating component is derived from a quotient of one of the alternating-signal components and a sum of the two alternating-signal components.

12. The method according to claim 11, wherein an effective Verdet constant is derived from the angular direct component.

13. The method according to claim 8, wherein an effective Verdet constant is derived from the angular direct component.

14. The method according to claim 1, wherein the angular direct component is derived from a quotient of a difference of the alternating-signal components of the first and second electrical signals and a sum of the two alternating-signal components.

15. The method according to claim 14, wherein an effective Verdet constant is derived from the angular direct component.

16. The method according to claim 1, wherein the angular alternating component is derived from a quotient of one of the alternating-signal components and a sum of the two alternating-signal components.

17. The method according to claim 16, wherein an effective Verdet constant is derived from the angular direct component.

18. The method according to claim 1, wherein an effective Verdet constant is derived from the angular direct component.

19. A device for measuring alternating electrical current in a current conductor, said device comprising:
   a) a Faraday element, associated with the current conductor, which receives and emits light;
   b) a polarized light supply, which supplies linearly polarized light to the Faraday element, wherein a plane of polarization of the linearly polarized light is rotated through a measuring angle on the basis of the Faraday effect and the measuring angle is dependent on the alternating current;
   c) a beam-splitting analyzer, optically connected to the Faraday element, which divides the linearly polarized light emitted from the Faraday element into first and second light signals, the first and second light signals having different polarization planes;
   d) first and second optoelectric converters for respectively converting the first and second light signals into first and second electrical signals, each electrical signal being dependent upon the intensity of a corresponding light signal;
   e) means for dividing said first electrical signal into a first alternating-signal component and a first direct-signal component and dividing said second electrical signal into a second alternating-signal component and a second direct-signal component; and
   f) an evaluator unit which:
      1) derives an angular direct component from the direct-signal components, the angular direct component being dependent upon a temperature of the Faraday element and optical transmission paths for the light,
      2) derives an angular alternating component from the alternating-signal components, the angular alternating component being dependent upon the alternating current and the temperature, and
      3) determines a substantially temperature-independent measuring signal for the alternating current from the angular alternating component and the angular direct component.

20. The device according to claim 19, further comprising a polarization-sustaining optical waveguide optically interconnecting the Faraday element and the beam-splitting analyzer.

21. The device according to claim 20, wherein the means for dividing comprises low-pass and high-pass filters.

22. The device according to claim 19, wherein the means for dividing comprises low-pass and high-pass filters.

* * * * *